US010816259B2

(12) United States Patent
Suzuki et al.

(10) Patent No.: US 10,816,259 B2
(45) Date of Patent: Oct. 27, 2020

(54) SUBSTRATE TRANSPORT APPARATUS, SUBSTRATE PROCESSING APPARATUS, AND DEW CONDENSATION SUPPRESSION METHOD

(71) Applicant: Ebara Corporation, Tokyo (JP)

(72) Inventors: Kenichi Suzuki, Tokyo (JP); Ryuichi Kosuge, Tokyo (JP); Kenichiro Saito, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 376 days.

(21) Appl. No.: 15/474,113

(22) Filed: Mar. 30, 2017

(65) Prior Publication Data

US 2017/0284727 A1 Oct. 5, 2017

(30) Foreign Application Priority Data

Apr. 4, 2016 (JP) .................... 2016-075266

(51) Int. Cl.
*F25D 21/04* (2006.01)
*H01L 21/67* (2006.01)
*H01L 21/68* (2006.01)
*H01L 21/677* (2006.01)
*H01L 21/687* (2006.01)
*F26B 15/00* (2006.01)

(52) U.S. Cl.
CPC .............. *F25D 21/04* (2013.01); *F26B 15/00* (2013.01); *H01L 21/67173* (2013.01); *H01L 21/67207* (2013.01); *H01L 21/67219* (2013.01); *H01L 21/67742* (2013.01); *H01L 21/67766* (2013.01); *H01L 21/68707* (2013.01); *H01L 21/68728* (2013.01)

(58) Field of Classification Search
CPC .......... H01L 21/67742; H01L 21/68707; H01L 21/68728
See application file for complete search history.

(56) References Cited

U.S. PATENT DOCUMENTS

| 3,578,034 | A | * | 5/1971 | Eminger | ............ H02K 15/0457 140/1 |
| 5,474,641 | A | * | 12/1995 | Otsuki | ....................... C23C 8/06 438/694 |
| 7,850,817 | B2 | | 12/2010 | Wakabayashi et al. | |
| 8,795,032 | B2 | | 8/2014 | Miyazaki et al. | |
| 2002/0157692 | A1 | * | 10/2002 | Ishihara | .................... B08B 1/04 134/134 |
| 2009/0067959 | A1 | * | 3/2009 | Takahashi | ............. B24B 37/345 414/226.01 |
| 2019/0148210 | A1 | * | 5/2019 | Shibata | ................ B25J 15/0033 294/103.1 |

FOREIGN PATENT DOCUMENTS

| JP | 2001-135604 A | 5/2001 |
| JP | 5188952 B | 4/2013 |

* cited by examiner

*Primary Examiner* — Joseph J Hail
*Assistant Examiner* — J Stephen Taylor
(74) *Attorney, Agent, or Firm* — Abelman, Frayne & Schwab

(57) ABSTRACT

A substrate transport apparatus includes a substrate holding unit configured to hold a substrate; a casing; and a drive mechanism at least partially provided within the casing and configured to drive the substrate holding unit using air. The drive mechanism is capable of supplying air into the casing.

8 Claims, 7 Drawing Sheets

170

170

170

170 sed on and claims priority from
SUBSTRATE TRANSPORT APPARATUS, SUBSTRATE PROCESSING APPARATUS, AND DEW CONDENSATION SUPPRESSION METHOD

CROSS-REFERENCE TO RELATED APPLICATIONS

This application is based on and claims priority from Japanese Patent Application No. 2016-075266, filed on Apr. 4, 2016, with the Japan Patent Office, the disclosure of which is incorporated herein in its entirety by reference.

TECHNICAL FIELD

The present disclosure relates to a substrate transport apparatus of transporting a substrate, a substrate processing apparatus including the substrate transport apparatus, and a dew condensation suppression method of suppressing an occurrence of dew condensation in the substrate transport apparatus.

BACKGROUND

A substrate processing apparatus that polishes a substrate such as a semiconductor wafer includes, for example, a cleaning unit that cleans a polished substrate, a drying unit that dries a cleaned substrate, and a transport mechanism that transports the substrate between units, in addition to a polishing unit.

However, a rinse water is supplied into the substrate processing apparatus in order to moisturize the substrate. When the supplied rinse water is applied to the transport mechanism, dew condensation may occur in the transport mechanism so that the transport mechanism may not be normally operated, thereby disrupting the transport. See, for example, Japanese Patent Laid-Open Publication No. 2001-135604 and Japan Patent No. 5188952.

SUMMARY

According to an aspect of the present disclosure, there is provided a substrate transport apparatus including: a substrate holding unit configured to hold a substrate; a casing; and a drive mechanism at least partially provided within the casing, and configured to drive the substrate holding unit using air. The drive mechanism is capable of supplying air into the casing.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
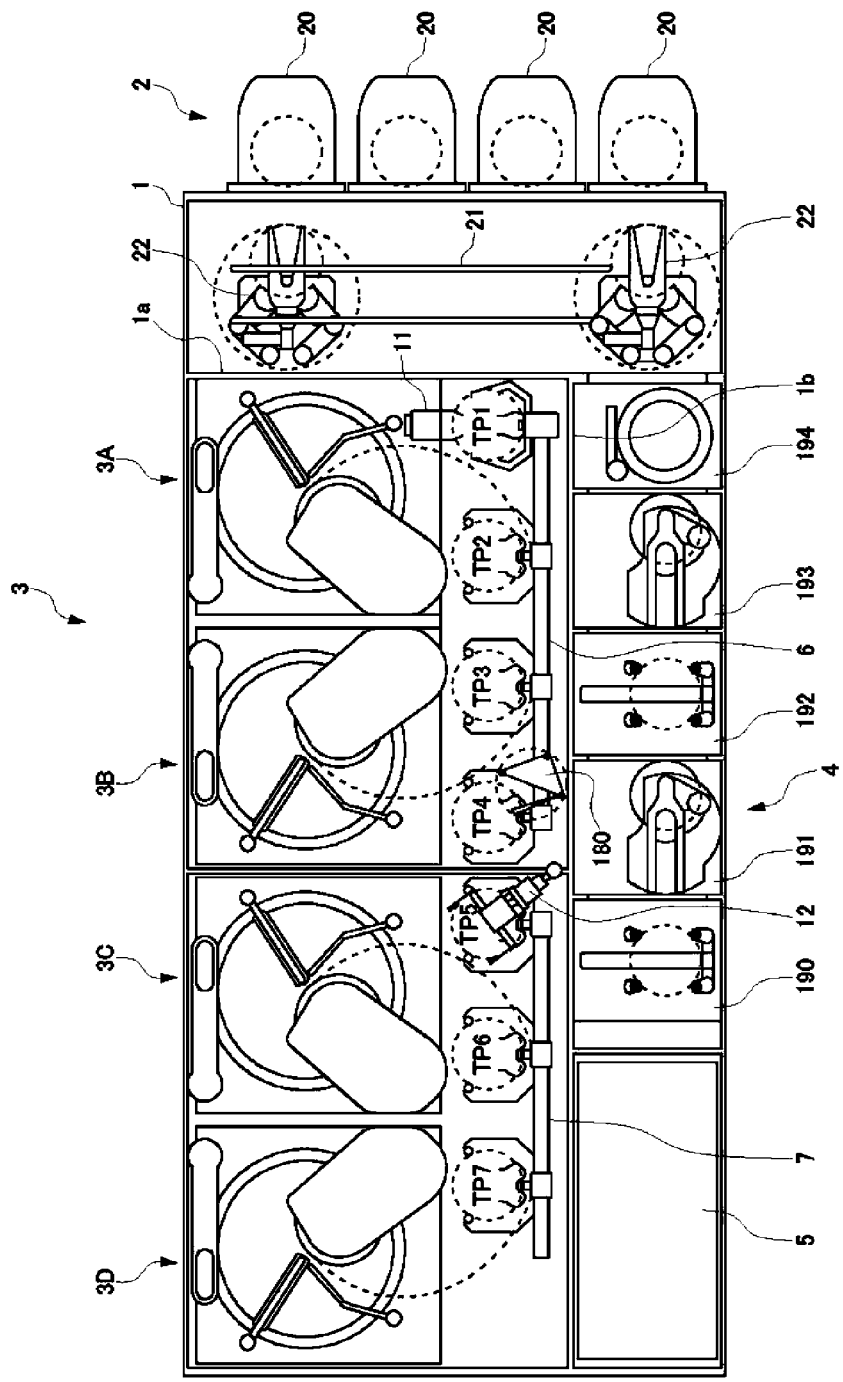
FIG. 1 is a view illustrating a schematic configuration of a substrate processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure has been made in view the problems described above and provides a substrate transport apparatus capable of suppressing an occurrence of dew condensation, a substrate processing apparatus including the substrate transport apparatus, and a dew condensation suppression method of suppressing an occurrence of dew condensation in the substrate transport apparatus.

According to an aspect of the present disclosure, there is provided a substrate transport apparatus including: a substrate holding unit configured to hold a substrate; a casing; and a drive mechanism at least partially provided within the casing and configured to drive the substrate holding unit using air. The drive mechanism is capable of supplying air into the casing.

By supplying air into the casing, it is possible to suppress an occurrence of dew condensation in the casing.

The drive mechanism may include a pipe at least partially provided within the casing and configured to supply air for driving the substrate holding unit and supply the air into the casing.

The substrate holding unit may include a pair of openable/closable support arms, and the drive mechanism may include an air cylinder provided within the casing and configured to open/close the pair of support arms by the air, and a pipe configured to supply the air to the air cylinder.

The pipe may include a first pipe pressurized when the substrate holding unit holds the substrate, and a second pipe pressurized when the substrate holding unit does not hold the substrate. The air may be supplied from the second pipe into the casing.

The substrate transport apparatus may include an orifice provided in the pipe.

The substrate transport apparatus may include a filter provided in the pipe, and the air may be supplied into the casing through the filter.

According to another aspect of the present disclosure, there is provided a substrate processing apparatus including: a polishing unit, a cleaning unit, a drying unit, and the substrate transport apparatus configured to transport a substrate between the units.

According to a further aspect of the present disclosure, there is provided a dew condensation suppression method of suppressing an occurrence of dew condensation in a substrate transport apparatus. The method also supplies air for driving a substrate holding unit configured to hold a substrate to a casing of the substrate transport apparatus.

By supplying the air, it is possible to suppress an occurrence of dew condensation.

Hereinafter, an exemplary embodiment according to the present disclosure will be described in detail with reference to accompanying drawings.

FIG. 1 is a view illustrating a schematic configuration of a substrate processing apparatus. As illustrated in FIG. 1, the substrate processing apparatus includes a substantially rectangular housing 1, and the interior of the housing 1 is partitioned into a load/unload section 2, a polishing section 3, and a cleaning section 4 by partition walls 1a and 1b. The substrate processing apparatus includes a controller 5 that controls a substrate processing operation.

The load/unload section 2 includes front load units 20 on each of which a wafer cassette storing a plurality of substrates (e.g., semiconductor wafers) is placed. In the load/unload section 2, a traveling mechanism 21 is laid along the arrangement of the front load units 20, and one transport robot (loader) 22 movable along the arrangement direction of the wafer cassettes is provided on the traveling mechanism 21. The transport robot 22 is configured to access the wafer cassettes mounted on the front load units 20 while moving on the traveling mechanism 21.

The polishing section 3 is a region where substrates are polished (planarized), and includes a first polishing unit 3A, a second polishing unit 3B, a third polishing unit 3C, and a fourth polishing unit 3D.

The cleaning section 4 is a region where the polished substrates are cleaned and dried, and includes a first cleaning unit 190 and a second cleaning unit 192 that clean the substrates, a drying unit 194 that dries the cleaned substrates, a first transport unit 191 that transports the substrates between the first cleaning unit 190 and the second cleaning unit 192, and a second transport unit 193 that transports the substrates between the second cleaning unit 192 and the drying unit 194.

Thereafter, the transport of the substrate will be described. The substrate processing apparatus includes a first linear transporter 6 and a second linear transporter 7 which transport the substrates along the longitudinal direction of the housing 1, a lifter 11, and a swing transporter 12 that has a function of inverting the front and rear sides of each of the substrates and is swingable.

The lifter 11 is disposed at a first transport position TP1 to be described below and receives the substrates from the transport robot 22. That is, a shutter (not illustrated) positioned between the lifter 11 and the transport robot 22 is provided in the partition wall 1a. When the substrates are transported, the shutter is opened and the substrates are delivered from the transport robot 22 to the lifter 11. The substrates are delivered from the transport robot 22 to the first linear transporter 6 through the lifter 11.

The first linear transporter 6 is disposed adjacent to the first polishing unit 3A and the second polishing unit 3B. The first linear transporter 6 transports the substrates between four transport positions along the arrangement direction of the polishing units 3A and 3B (a first transport position TP1, a second transport position TP2, a third transport position TP3, and a fourth transport position TP4).

That is, the substrates are transported to the polishing units 3A and 3B by the first linear transporter 6. More specifically, at the second transport position TP2, the substrate is delivered from the first linear transporter 6 to the first polishing unit 3A. At the third transport position TP3, the substrate is delivered from the first linear transporter 6 to the second polishing unit 3B.

The swing transporter 12 is disposed between the first linear transporter 6, the second linear transporter 7, and the cleaning section 4. The delivery of the substrates from the first linear transporter 6 to the second linear transporter 7 is performed by the swing transporter 12.

The second linear transporter 7 is disposed adjacent to the third polishing unit 3C and the fourth polishing unit 3D. The second linear transporter 7 is a mechanism that transports the substrates between three transport positions along the arrangement direction of the polishing units 3C and 3D (a fifth transport position TP5, a sixth transport position TP6, and a seventh transport position TP7).

That is, the substrates are transported to the polishing units 3C and 3D by the second linear transporter 7. More specifically, at the sixth transport position TP6, the substrate is delivered from the second linear transporter 7 to the third polishing unit 3C. At the seventh transport position TP7, the substrate is delivered from the second linear transporter 7 to the fourth polishing unit 3D.

The substrate polished by the polishing section 3 is delivered from the first linear transporter 6 (or the second linear transporter 7) to a temporary placing table 180 by the swing transporter 12, and is transported to the cleaning section 4 through the first transport unit 191. A shutter (not illustrated) positioned between the temporary placing table 180 and the first transport unit 191 is provided in the partition wall 1b. When the substrate is transported, the shutter is opened, and the substrate is received by the first transport unit 191 from the temporary placing table 180.

Figure 2:
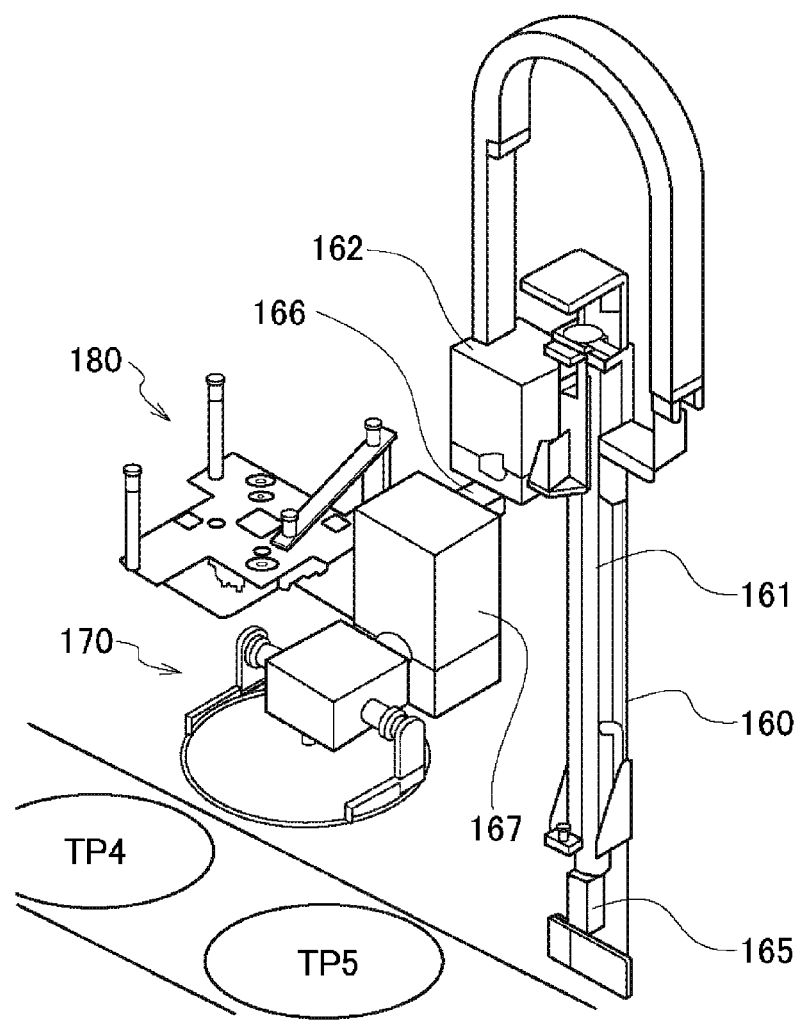
FIG. 2 is a perspective view illustrating the structure of a swing transporter according to an exemplary embodiment.

FIG. 2 is a perspective view illustrating the structure of the swing transporter 12 according to an exemplary embodiment. The swing transporter 12 is a substrate transport mechanism provided in a frame 160 of the substrate processing apparatus, and includes a linear guide 161 extending in the vertical direction, a swing mechanism 162 attached to the linear guide 161, and a lift drive mechanism 165 that moves the swing mechanism 162 in the vertical direction. As the lift drive mechanism 165, for example, a robot cylinder having a servo motor and a ball screw may be employed.

An inverting mechanism 167 is connected to the swing mechanism 162 via a swing arm 166. A holding mechanism 170 that holds the substrate is connected to the inverting mechanism 167. The temporary placing table 180 installed on the frame 160 is disposed on the side of the swing transporter 12. The temporary placing table 180 is positioned between the first linear transporter 6 and the cleaning section 4 in FIG. 1.

The swing arm 166 is configured to pivot around the rotation axis of a motor (not illustrated) of the swing mechanism 162 by driving of the motor. Accordingly, while the inverting mechanism 167 and the holding mechanism 170 integrally pivot, the holding mechanism 170 moves among the fourth transport position TP4, the fifth transport position TP5, and the temporary placing table 180.

Figure 3:
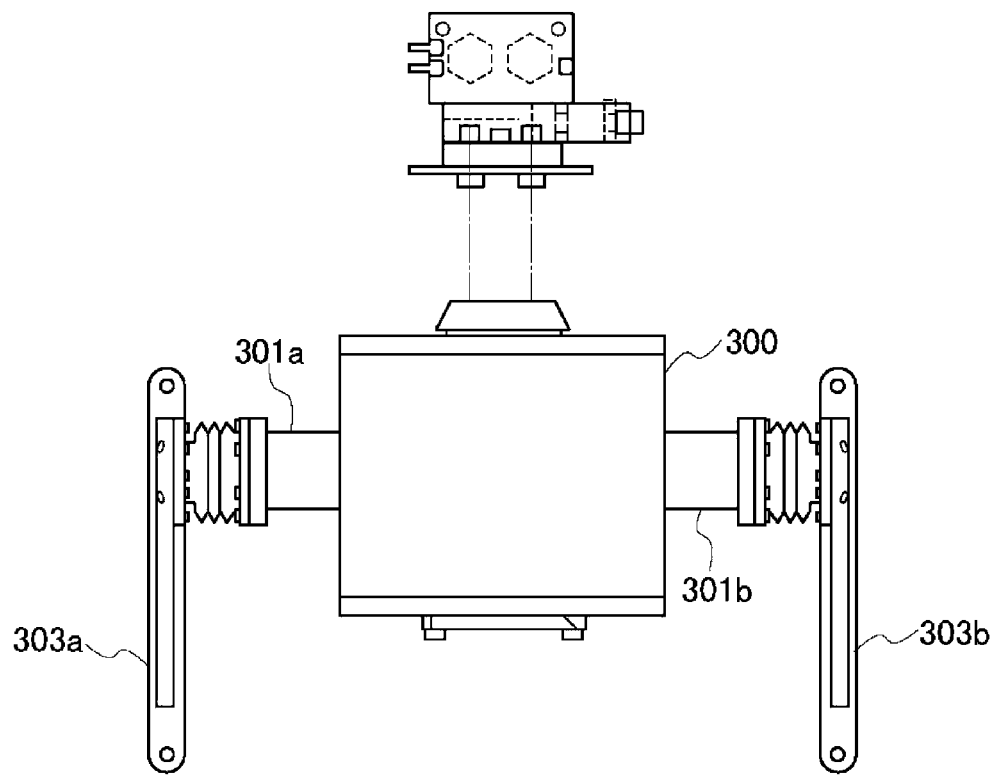
FIG. 3 is a top plan view of a holding mechanism.
Figure 4A:
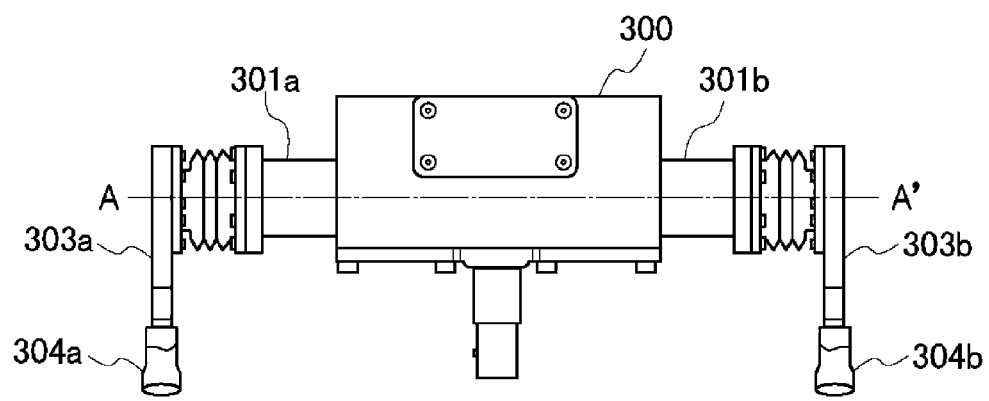
FIG. 4A is a front view of the holding mechanism.
Figure 4B:
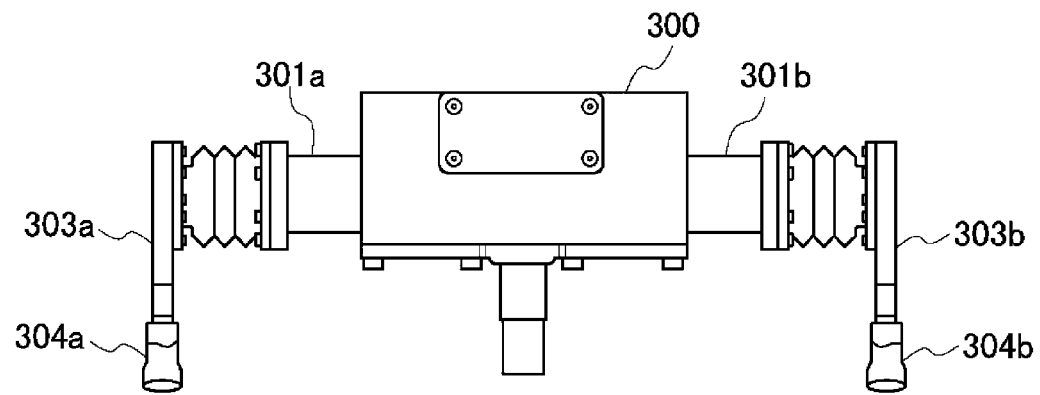
FIG. 4B is a front view of the holding mechanism.
Figure 5:
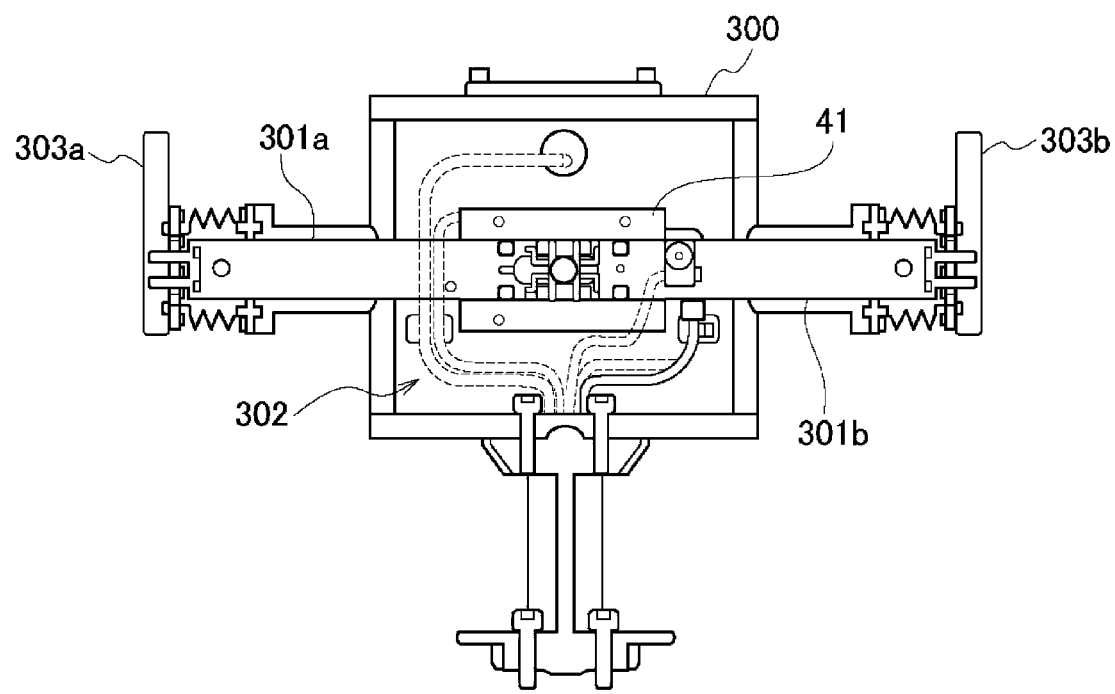
FIG. 5 is a sectional view taken along A-A' of FIG. 4A.

FIG. 3 is a top plan view of the holding mechanism 170, and FIGS. 4A and 4B are front views of the holding mechanism 170. FIG. 5 is a sectional view taken along A-A' of FIG. 4A. The holding mechanism 170 includes a casing 300, a pair of movable arms 301a and 301b extending on both sides from side surfaces of the casing 300, an open/close drive mechanism 302 (FIG. 5) that moves the movable arms 301a and 301b, and support arms 303a and 303b attached to distal ends of the movable arms 301 and extending in directions orthogonal to the movable arms 301a and 301*b*, respectively. The movable arms 301*a* and 301*b* and the support arms 303*a* and 303*b* constitute a substrate holding unit.

The support arms 303*a* and 303*b* may be placed in an opened state (FIG. 4B) and a closed state (FIG. 4A), and hold the substrate in the closed state. The support arms 303*a* and 303*b* are provided with chucks 304*a* and 304*b* projecting downward from both ends of the support arms 303*a* and 303*b* and configured to support the peripheral edge portion of the substrate.

The movable arms 301*a* and 301*b* are driven by the open/close drive mechanism 302 having an air chuck 41, and moves in mutually approaching (FIG. 4A) and separating (FIG. 4B) directions. The swing mechanism 162 is movable in the vertical direction by the lift drive mechanism 165 illustrated in FIG. 2. Accordingly, the inverting mechanism 167 and the holding mechanism 170 are integrally raised and lowered, and the holding mechanism 170 is raised and lowered among the fourth transport position TP4, the fifth transport position TP5, and the temporary placing table 180.

Figure 6:
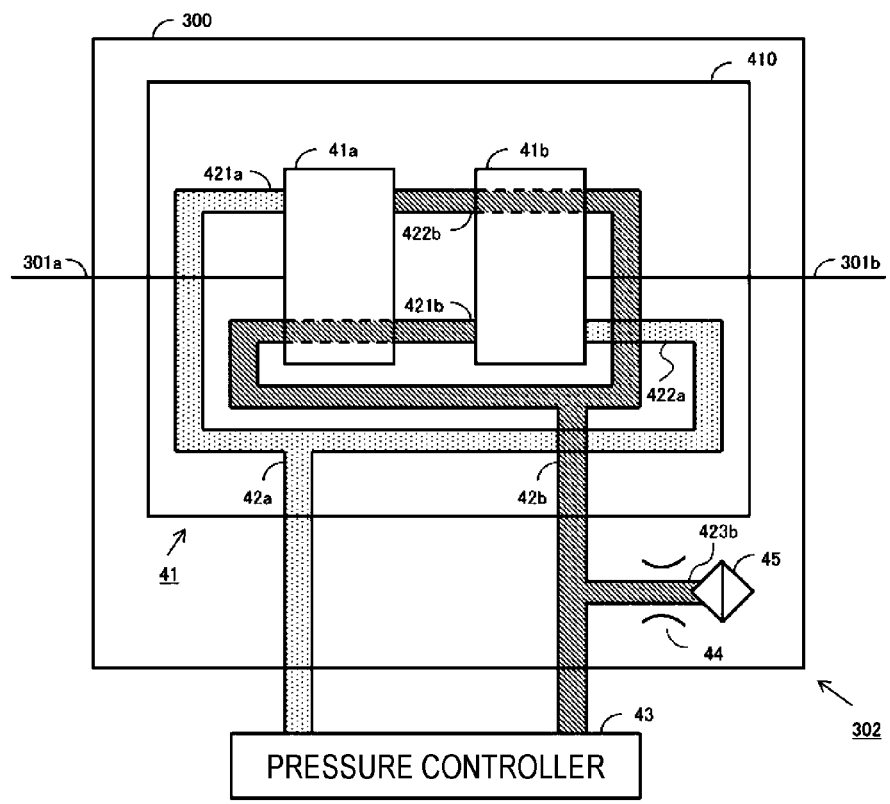
FIG. 6 is a schematic view illustrating the schematic configuration of an open/close drive mechanism.

FIG. 6 is a schematic view illustrating the schematic configuration of the open/close drive mechanism 302. The open/close drive mechanism 302 opens or closes the support arms 303*a* and 303*b* using air, and includes the air chuck 41, pipes 42*a* and 42*b*, and a pressure controller 43. The air chuck 41 includes a housing 410, and air cylinders 41*a* and 41*b* that are capable of sliding laterally. The air cylinders 41*a* and 41*b* slide by the pipes 42*a* and 42*b*, respectively.

The air cylinders 41*a* and 41*b* are provided in the housing 410 provided within the casing 300, and are attached with the movable arms 301*a* and 301*b*, respectively. That is, one end of the movable arm 301*a* is attached to the air cylinder 41*a* through the casing 300 and the housing 410, and the support arm 303*a* (not illustrated in FIG. 6) is attached to the other end of the movable arm 301*a*. One end of the movable arm 301*b* is attached to the air cylinder 41*b* through the casing 300 and the housing 410, and the support arm 303*b* (not illustrated in FIG. 6) is attached to the other end of the movable arm 301*b*.

One end of the pipe 42*a* indicated by spots in FIG. 6 is connected to the pressure controller 43. The pipe 42*a* splits within the housing 410. One distal end portion 421*a* is connected to the left side surface of the air cylinder 41*a*, and the other distal end portion 422*a* is connected to the right side surface of the air cylinder 41*b*.

One end of the pipe 42*b* indicated by diagonal lines in FIG. 6 is connected to the pressure controller 43. The pipe 42*b* splits within the housing 410. One distal end portion 421*b* is connected to the left side surface of the air cylinder 41*b*, and the other distal end portion 422*b* is connected to the right side surface of the air cylinder 41*a*.

The pressure controller 43 pressurizes the pipes 42*a* and 42*b* by supplying air, or exhausts the pipes 42*a* and 42*b*. The pressure controller 43 may be provided within the casing 300, or outside the casing 300. When the pressure controller 43 is provided outside the casing 300, a part of the pipes 42*a* and 42*b* is present outside the casing 300.

Figure 7:
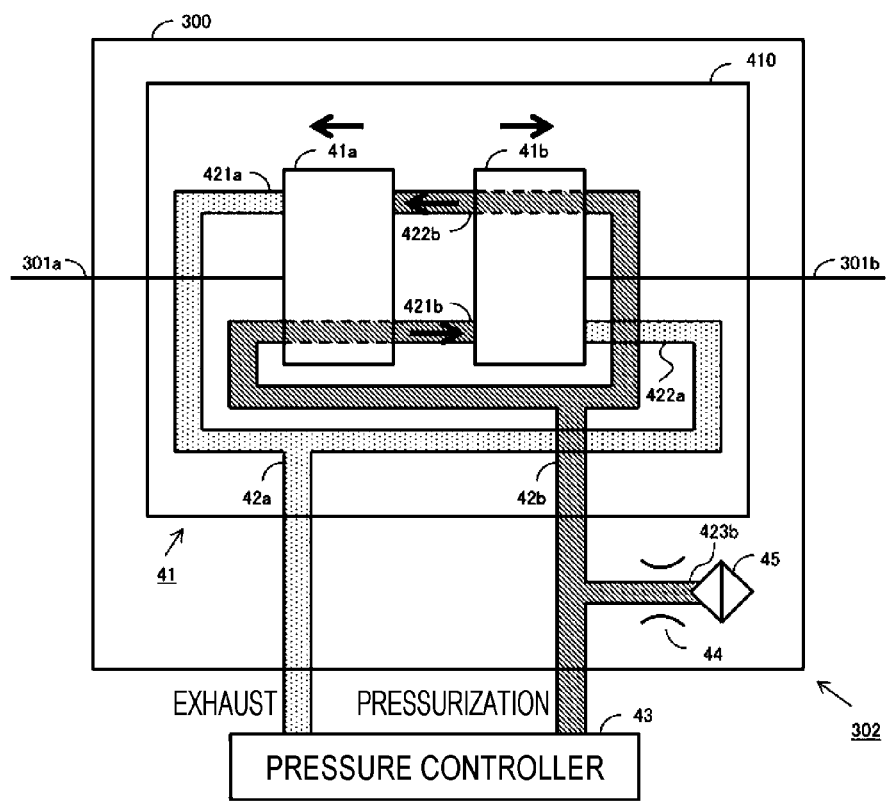
FIG. 7 is a view illustrating an operation of the open/close drive mechanism when movable arms are caused to separate from each other.

FIG. 7 is a view illustrating an operation of the open/close drive mechanism 302 when the movable arms 301 are caused to separate from each other. The pressure controller 43 exhausts the pipe 42*a*, and pressurizes the pipe 42*b*. The exhaust of the pipe 42*a* may be temporary until air within the pipe 42*a* comes out, while the pressurization (air supply) of the pipe 42*b* is continuously performed. Accordingly, the distal end portion 421*b* of the pipe 42*b* moves the air cylinder 41*b* to the right side, and the distal end portion 422*b* moves the air cylinder 41*a* to the left side. Accordingly, the air cylinders 41*a* and 41*b* are separated from each other, and the movable arms 301*a* and 301*b* attached thereto are separated from each other. As a result, the support arms 303*a* and 303*b* are opened. That is, the pipes 42*a* and 42*b* may supply air for driving the support arms 303*a* and 303*b*.

Figure 8:
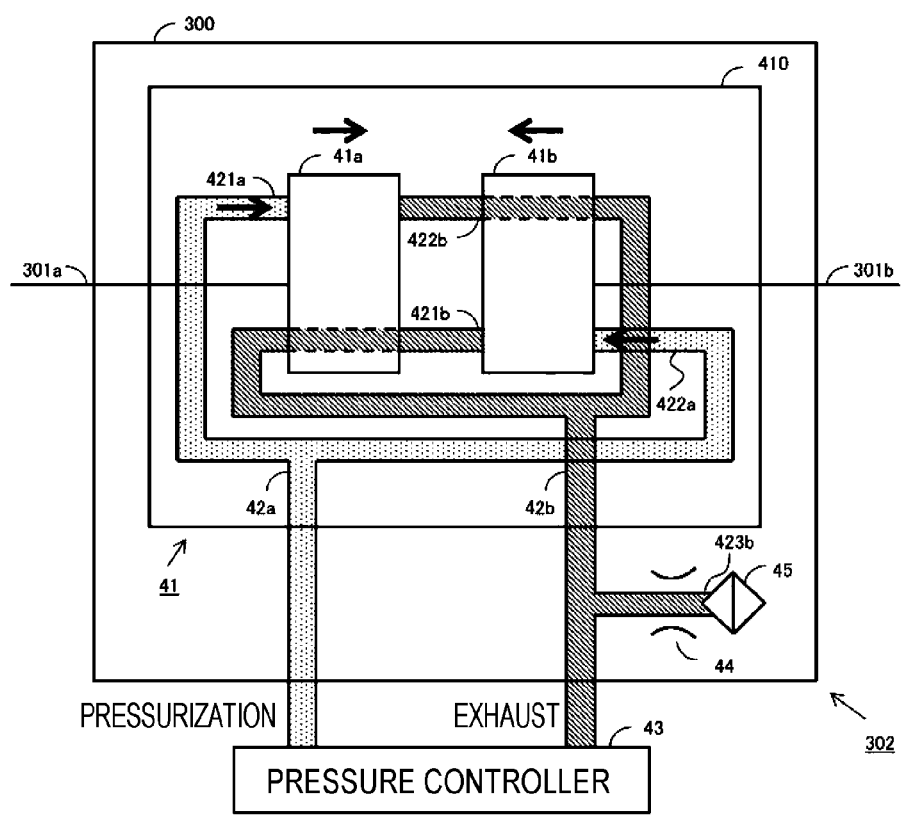
FIG. 8 is a view illustrating an operation of the open/close drive mechanism when the movable arms are caused to approach each other.

FIG. 8 is a view illustrating an operation of the open/close drive mechanism 302 when the movable arms 301 are caused to approach each other. The pressure controller 43 exhausts the pipe 42*b*, and pressurizes the pipe 42*a*. The exhaust of the pipe 42*b* may be temporary until air within the pipe 42*b* comes out, while the pressurization (air supply) of the pipe 42*a* is continuously performed. Accordingly, the distal end portion 421*a* of the pipe 42*a* moves the air cylinder 41*a* to the right side, and the distal end portion 422*a* moves the air cylinder 41*b* to the left side. Accordingly, the air cylinders 41*a* and 41*b* approach each other, and the movable arms 301*a* and 301*b* attached thereto approach each other. As a result, the support arms 303*a* and 303*b* are closed.

A substrate transport by the above described swing transporter 12 will be described.

As illustrated in FIG. 4B, in a stand-by mode where the substrate is not held, the movable arms 301*a* and 301*b* are separated from each other.

Figure 9A:
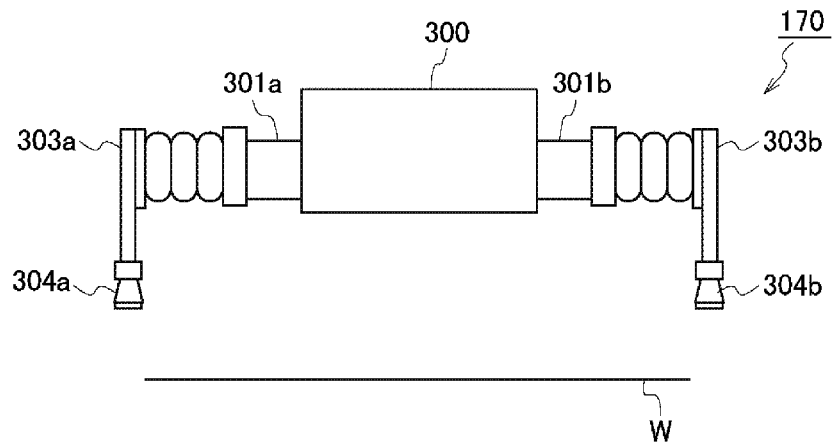
FIG. 9A is a view illustrating an operation of the holding mechanism when a substrate is held.
Figure 9B:
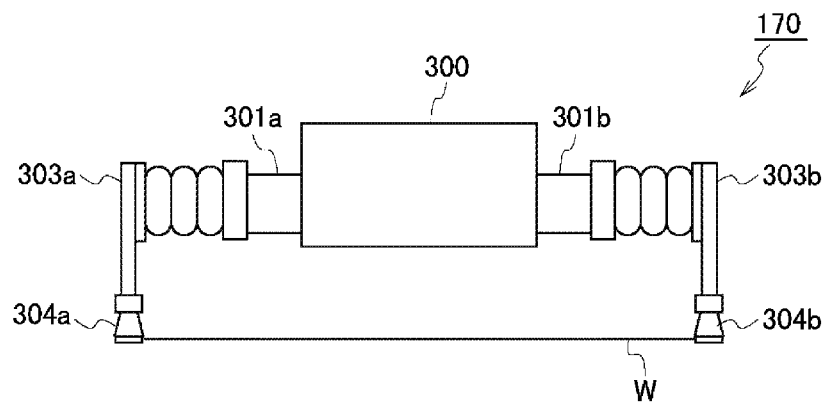
FIG. 9B is a view illustrating an operation of the holding mechanism when the substrate is held.
Figure 9C:
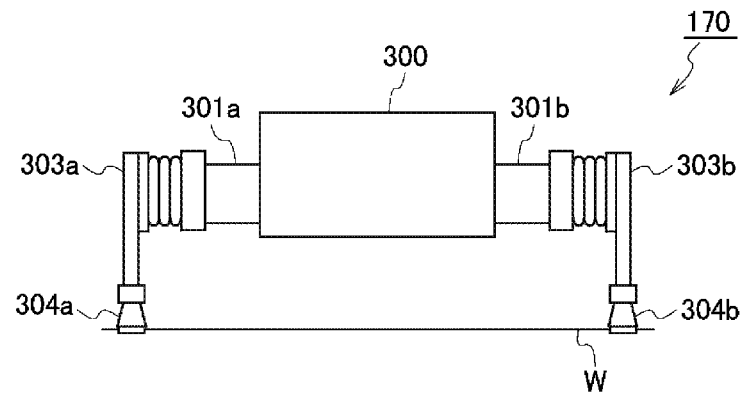
FIG. 9C is a view illustrating an operation of the holding mechanism when the substrate is held.

FIGS. 9A to 9C are views illustrating operations of the holding mechanism 170 when the substrate is held. The drawings illustrate a state where the substrate W transported by the first linear transporter 6 (not illustrated) is delivered to the holding mechanism 170 at the fourth transport position TP4.

As illustrated in FIG. 9A, the holding mechanism 170 of the swing transporter 12 is moved to a position above the substrate W placed on the first linear transporter 6. Here, the movable arms 301*a* and 301*b* are separated from each other, and the support arms 303*a* and 303*b* are opened.

Then, as illustrated in FIG. 9B, the holding mechanism 170 is lowered by being driven by the lift drive mechanism 165 (FIG. 2) such that the chucks 304*a* and 304*b* are positioned at sides of the substrate W.

Subsequently, as illustrated in FIG. 9C, the movable arms 301*a* and 301*b* are caused to approach each other by the open/close drive mechanism 302, and the support arms 303*a* and 303*b* are closed. Accordingly, the peripheral edge of the substrate W is held by the chucks 304*a* and 304*b*. Thereafter, the holding mechanism 170 is raised by being driven by the lift drive mechanism 165.

Such a swing transporter 12 transports the substrate W placed on the fourth transport position TP4 to the fifth transport position TP5 in the following manner in order to move the substrate W from the first linear transporter 6 to the second linear transporter 7.

First, the swing transporter 12 moves to a position above the fourth transport position TP4, in the state where the support arms 303*a* and 303*b* are opened (FIG. 9A). Subsequently, the holding mechanism 170 is lowered (FIG. 9B), and the substrate W placed on the fourth transport position TP4 is held by the support arms 303*a* and 303*b* (FIG. 9C). Thereafter, the holding mechanism 170 that is supporting the substrate W is raised, and swings by being driven by the swing mechanism 162 while moving to the position above the fifth transport position TP5. Next, the holding mechanism 170 is lowered, and the support arms 303*a* and 303*b* are opened so that the substrate W is placed on the fifth transport position TP5.

The swing transporter 12 transports the substrate W placed on the fifth transport position TP5 to the temporary placing table 180 in the following manner in order to move the substrate W from the fourth transport position TP4 (or the fifth transport position TP5) to the cleaning section 4 and invert the substrate W.

First, the swing transporter 12 moves to a position above the fifth transport position TP5 in the state where the support arms 303a and 303b are opened (FIG. 9A). Subsequently, the holding mechanism 170 is lowered (FIG. 9B), and the substrate W placed on the fifth transport position TP5 is held by the support arms 303a and 303b (FIG. 9C). Thereafter, the holding mechanism 170 that is supporting the substrate W is raised and the inverting mechanism 167 inverts the substrate W. Subsequently, the holding mechanism 170 swings by being driven by the swing mechanism 162 while moving to a position above the temporary placing table 180. Then, the holding mechanism 170 is lowered, and the support arms 303a and 303b are opened so that the substrate W is placed on the temporary placing table 180.

Here, since the interior of the substrate processing apparatus illustrated in FIG. 1 is high in humidity, air with high humidity may flow into the casing 300. Further, a rinse water is supplied from various sources to the substrate processing apparatus in order to moisturize the substrate even in a stand-by mode where the substrate is not processed. In some cases, the swing transporter 12 may be bathed in the rinse water so that the casing 300 may be cooled. When dew condensation occurs inside (for example, at the ceiling surface) the casing 300 of the swing transporter 12, the dew condensation may adversely affect the operation of the air cylinders 41a and 41b within the casing 300, thereby disrupting the transport of the substrate.

Therefore, in the present exemplary embodiment, a structure of suppressing the dew condensation is provided.

As illustrated in FIG. 6, in the open/close drive mechanism 302 in the holding mechanism 170, the pipe 42b provided within the casing 300 is split outside the housing 410, and air is supplied from a distal end portion 423b into the casing 300 and circulated. Preferably, the open/close drive mechanism 302 includes an orifice 44, and gradually supplies air into the casing 300 so as not to affect other members such as the air cylinders 41a and 41b. Preferably, the open/close drive mechanism 302 includes a filter 45 and supplies clean air into the casing 300 through the filter 45. By supplying the air into the casing 300 in this manner, air circulation occurs, and a temperature change is reduced. Thus, an occurrence of dew condensation may be suppressed.

Only the pipe 42b may be split to supply air, only the pipe 42a may be split to supply air, and air may be supplied from both the pipes 42a and 42b into the casing 300. Meanwhile, it is more desirable to split the pipe 42b that is pressurized when the movable arms 301 are separated from each other (that is, when the substrate W is not held). Accordingly, air is capable of being supplied into the casing 300 when the substrate W is not held. As described above, when air is capable of being supplied into the casing in a state where the substrate is not held, it is possible to minimize the possibility that air is applied to the substrate.

As described above, in the present exemplary embodiment, since air is supplied into the casing 300, an occurrence of dew condensation within the casing 300 may be suppressed. Furthermore, since air for driving the movable arms 301a and 301b is used, additional members may be kept to a minimum.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate transport apparatus comprising:
   a casing;
   a pair of movable arms that extend from opposite sides of the casing, each movable arm having a support arm fixed to a distal end of each of the movable arms, each support arm extending in a direction orthogonal to each of the movable arms, the support arms configured to hold a substrate;
   an air chuck disposed within the casing that includes a first air cylinder attached to one of the pair of movable arms and a second air cylinder attached to an other of the pair of movable arms, the air chuck configured to drive each support arm simultaneously towards and away from each other using air; and
   a first pipe and a second pipe configured to supply the air to each of the first air cylinder and the second air cylinder respectively, through the casing,
   wherein the second pipe is split within the casing to form a third pipe having an opening positioned in the casing and outside of the air chuck, and the opening is configured to supply air to the casing.

2. The substrate transport apparatus of claim 1, wherein the first pipe is pressurized when the support arms hold the substrate, and the second pipe is pressurized when the support arms do not hold the substrate, and
   wherein the air is supplied from the opening of the second pipe into the casing when the second pipe is pressurized.

3. The substrate transport apparatus of claim 1, further comprising:
   an orifice provided in the third pipe.

4. The substrate transport apparatus of claim 1, further comprising:
   a filter provided in the third pipe,
   wherein the air is supplied into the casing through the filter.

5. The substrate transport apparatus of claim 1, wherein the second pipe is configured to supply the air into the casing through the opening when the pair of arms do not hold the substrate.

6. The substrate transport apparatus of claim 1, wherein the air chuck further includes a housing,
   wherein the first pipe is split within the housing and has a first distal end attached to the first cylinder and a second distal end attached to the second cylinder, and
   wherein the second pipe is split within the housing and has a third distal end attached to the first cylinder and a fourth distal end attached to the second cylinder.

7. A substrate processing apparatus comprising:
   a polisher that polishes a substrate;
   a cleaner that cleans the substrate;
   a dryer that dries the substrate; and
   a substrate transporter configured to transport a substrate among the polisher, the cleaner, and the dryer, the substrate transport transporter including:
   a casing;
   a pair of movable arms that extend from opposite sides of the casing, each movable arm having a support arm fixed to a distal end of each of the movable arms, each support arm extending in a direction orthogonal to each of the movable arms, the support arms being configured to hold a substrate;

an air chuck disposed within the casing that includes a first air cylinder attached to one of the pair of movable arms and a second air cylinder attached to an other of the pair of movable arms, the air chuck configured to drive each support arm simultaneously towards and away from each other using air; and a first pipe and a second pipe configured to supply the air to each of the first air cylinder and the second air cylinder respectively, through the casing, wherein the second pipe is split within the casing to form a third pipe having an opening positioned in the casing and outside of the air chuck, the opening configured to supply air to the casing.

8. A method of suppressing an occurrence of dew condensation in a substrate transport apparatus, the method comprising:

providing the substrate transport apparatus including a casing, a pair of arms that extend from opposite sides of the casing, the pair of arms being configured to hold a substrate, and an air chuck disposed within the casing that includes a pair of air cylinders attached to the pair of arms and configured to drive the pair of arms using air;

supplying air for driving the pair of cylinders via a pair of pipes configured to supply air to the pair to the cylinders; and supplying the air to the casing of the substrate transport apparatus via an opening on a third pipe split from one of the pair of pipes when the substrate is not held, the opening being positioned in the casing and outside the air chuck.

* * * * *